United States Patent
We et al.

(10) Patent No.: US 10,049,977 B2
(45) Date of Patent: Aug. 14, 2018

(54) SEMICONDUCTOR PACKAGE ON PACKAGE STRUCTURE AND METHOD OF FORMING THE SAME

(71) Applicant: QUALCOMM Incorporated, San Diego, CA (US)

(72) Inventors: Hong Bok We, San Diego, CA (US); Dong Wook Kim, San Diego, CA (US); Jae Sik Lee, San Diego, CA (US); Kyu-Pyung Hwang, San Diego, CA (US); Young Kyu Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/450,201

(22) Filed: Aug. 1, 2014

(65) Prior Publication Data

US 2016/0035664 A1    Feb. 4, 2016

(51) Int. Cl.
*H01L 23/495*    (2006.01)
*H01L 23/498*    (2006.01)
(Continued)

(52) U.S. Cl.
CPC .... *H01L 23/49861* (2013.01); *H01L 21/4853* (2013.01); *H01L 23/49811* (2013.01); *H01L 23/49827* (2013.01); *H01L 25/105* (2013.01); H01L 23/3121 (2013.01); H01L 23/5389 (2013.01); H01L 25/0655 (2013.01); H01L 2224/16225 (2013.01); H01L 2225/1023 (2013.01); H01L 2225/1041 (2013.01); H01L 2924/181 (2013.01)

(58) Field of Classification Search
CPC ........... H01L 23/3128; H01L 23/49811; H01L 23/49861; H01L 23/3121
USPC .................................. 257/686, 666, E23.031
See application file for complete search history.

(56) References Cited

U.S. PATENT DOCUMENTS 6,239,496 B1 *  5/2001  Asada .................... H01L 21/563
                                                  257/685
6,424,031 B1 *  7/2002  Glenn ................. H01L 25/0657
                                                  257/676
(Continued)

FOREIGN PATENT DOCUMENTS

EP        2330621 A1    6/2011
JP     2013149876 A    8/2013

*Primary Examiner* — Nitin Parekh
(74) *Attorney, Agent, or Firm* — Muncy, Geissler, Olds & Lowe, P.C./Qualcomm

(57) ABSTRACT

A package on package structure may be formed by fabricating or providing a bottom package having a substrate, at least one die on top of the substrate, and bonding pads on the top of the substrate. Next, a frame is formed on the bonding pads and connected to the bonding pads. Next, a package material is molded over the top of the substrate to encapsulate the frame, the die, and the pads or substantially encapsulates these components. Next, a portion of the molded package material is removed to expose at least a portion of the frame. The exposed frame portions are formed such that a desired fan in or fan out configuration is obtained. Next, a non-conductive layer is formed on the exposed frame. Last, a second package having a die or chip is connected to the exposed portion of the frame to form a package on package structure.

5 Claims, 4 Drawing Sheets

(51) Int. Cl.
    *H01L 25/10*     (2006.01)
    *H01L 21/48*     (2006.01)
    *H01L 23/31*     (2006.01)
    *H01L 25/065*     (2006.01)
    *H01L 23/538*     (2006.01)

(56) References Cited

U.S. PATENT DOCUMENTS

| | | | |
|---|---|---|---|
| 6,861,288 B2 * | 3/2005 | Shim, II | H01L 25/0657 |
| | | | 257/686 |
| 7,195,957 B2 * | 3/2007 | Koon | H01L 23/3107 |
| | | | 257/685 |
| 7,361,533 B1 * | 4/2008 | Huemoeller | H01L 23/3128 |
| | | | 257/666 |
| 7,986,043 B2 | 7/2011 | Merilo et al. | |
| 8,389,338 B2 | 3/2013 | Liu et al. | |
| 8,580,609 B2 | 11/2013 | Xiao et al. | |
| 8,994,161 B2 * | 3/2015 | Ahr | H01L 21/561 |
| | | | 257/666 |
| 2005/0104194 A1 * | 5/2005 | Weng | H01L 23/3107 |
| | | | 257/706 |
| 2007/0209834 A1 * | 9/2007 | Kuan | H01L 23/49575 |
| | | | 174/520 |
| 2007/0210424 A1 * | 9/2007 | Ho | H01L 25/105 |
| | | | 257/678 |
| 2010/0019359 A1 * | 1/2010 | Pagaila | H01L 21/568 |
| | | | 257/659 |

\* cited by examiner

SEMICONDUCTOR PACKAGE ON PACKAGE STRUCTURE AND METHOD OF FORMING THE SAME

FIELD OF DISCLOSURE

This disclosure relates generally to semiconductor package on package structures, and more specifically, but not exclusively, to connections between package layers in a package on package structure.

BACKGROUND

Conventionally, package on package (PoP) type semiconductor packaging uses lots of different connection methods to connect the top package with the bottom package. These connection methods include solder ball, laser and plating process, pre-made Cu post, Cu pillar with a redistribution layer (RDL), Cu pillar bumping with a through mold via (TMV), substrate bar, TMV alone, and pre-ball TMV etc. This means a POP package needs some extra process or materials for top to bottom package connections. These extra process or materials add cost and complexity to the POP manufacturing process.

Accordingly, there are long-felt industry needs for methods that improve upon conventional methods including the improved methods and apparatus provided hereby.

The inventive features that are characteristic of the teachings, together with further objects and advantages, are better understood from the detailed description and the accompanying figures. Each of the figures is provided for the purpose of illustration and description only, and does not limit the present teachings.

SUMMARY

The following presents a simplified summary relating to one or more aspects and/or embodiments associated with the apparatus and methods disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the apparatus and methods disclosed herein in a simplified form to precede the detailed description presented below.

Some exemplary embodiments of the disclosure are directed to systems, apparatus, and methods for a PoP structure with a connection frame for interconnecting a top package with a bottom package.

In some embodiments of the disclosure, the system, apparatus, and method includes a connection frame extending between a bottom package and a top package in a POP structure.

In some embodiments of the disclosure a pre-formed frame is attached to a bottom package of a PoP structure, the frame is encapsulated in a molding material, then a portion of the molding material is removed to expose a portion of the frame.

Other objects and advantages associated with the apparatus and methods disclosed herein will be apparent to those skilled in the art based on the accompanying drawings and detailed description.

BRIEF DESCRIPTION OF THE DRAWINGS

The accompanying drawings are presented to describe examples of the present teachings, and are not limiting. The accompanying drawings are presented to aid in the description of embodiments of the disclosure and are provided solely for illustration of the embodiments and not limitation thereof.

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
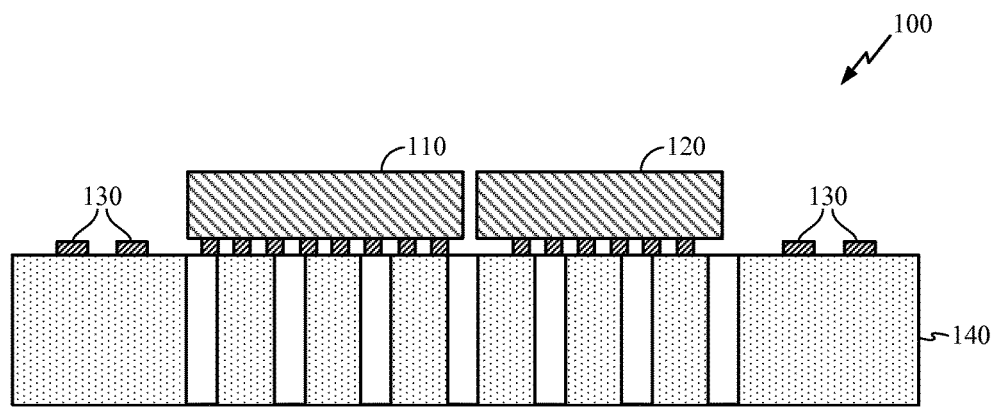
FIG. 1A depicts an exemplary block diagram of a bottom package structure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Methods, apparatus and systems for are provided. The exemplary methods, apparatus, and systems disclosed herein advantageously address the long-felt industry needs, as well as other previously unidentified needs, and mitigate shortcomings of the conventional methods, apparatus, and systems. For example, an advantage provided by the disclosed methods, apparatus, and systems herein is an improvement in semiconductor POP package structures. Also, embodiments of the disclosure provide a simpler process than current Cu post or solder paste, ball placement processes. According to some embodiments, there are less steps than conventional techniques (such as only 3 steps—lead frame placement, molding, and grinding) particularly for simple and low I/O application targets.

Various aspects are disclosed in the following description and related drawings to show specific examples relating to exemplary embodiments of the disclosure. Alternate embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular embodiments only and is not intended to be limiting of embodiments of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In this description, certain terminology is used to describe certain features. The term "mobile device" can describe, and is not limited to, a mobile phone, a mobile communication device, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

FIG. 1A depicts an exemplary bottom package structure. As shown in FIG. 1A, a bottom package structure 100 may include a first die 110, a second die 120, and a plurality of bonding pads 130. The die 110, die 120, and bonding pads 130 may be mounted on a substrate or interposer 140. The interposer 140 may provide an interface between a top and a bottom of the interposer 140 as well as an interface between components attached to the interposer 140.

Figure 1B:
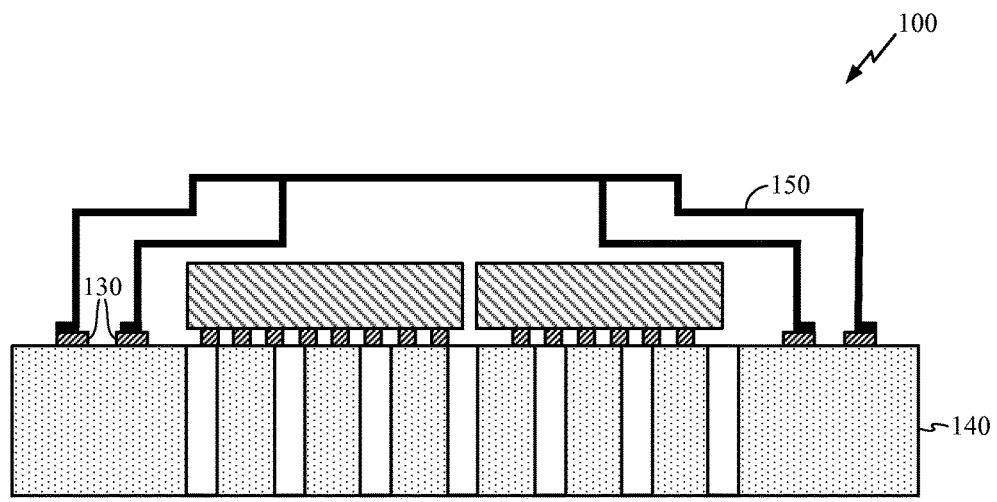
FIG. 1B depicts an exemplary block diagram of a bottom package structure with a connection frame.

FIG. 1B depicts an exemplary block diagram of a bottom package structure with a connection frame. As shown in FIG. 1B, a bottom package structure 100 may include a plurality of bonding pads 130 and a connection frame 150 coupled to the plurality of bonding pads 130. The connection frame 150 may be a conductive material such as lead. The connection frame 150 may be coupled to one or more bonding pads 130 and may be coupled with a solder or adhesive that allows an electrical connection between at least one pad and the frame.

The frame 150 may provide a connection between the interposer 140 and a top package (not shown). As shown, the frame 150 includes four branches that provide separate electrical pathways or connections but it should be understood that this can be more or less depending on the amount of connections or pathways desired. The frame 150 is shown with the branches connected together; however, the branches may be separated prior to connecting the frame 150 to a top package or die. In another embodiment, the branches may be formed separately such that they are not coupled together. The frame 150 branches are shown extending vertically and horizontally upward from the pads 130 to a point over the dies 110 and 120 that may easily allow connections with pinouts of a memory (not shown) situated directly above dies 110 and 120. It should be understood that the branches may be configured to be directed to any point necessary. For example, if the top package connection points are offset from the dies 110 and 120, the frame 150 may be configured to have branches that extend upward a various angles (such as 90 degrees) to arrive at a desired location for a specific top package connection pattern. The bonding pads may be 150 microns in pitch or smaller and the branches of the frame 150 coupled to the pads may be 200 microns or smaller in pitch. The interconnect pattern offset from the bonding pads has the advantage of avoiding the need for a fan in or fan out and RDL to align the top and bottom package connections. By avoiding the need to have an RDL, embodiments of the disclosure have the advantage of a more simplified process of manufacture with less steps (no RDL process step is required) that may result in cost savings as well as less complex steps such as those required for Cu pillars. The offset interconnect pattern according to embodiments of the disclosure also provides an advantageous tighter pitch (150 μm or less) than that achievable by conventional process/ structures (400 μm or greater) such as TMVs, Cu pillars, and PoP vias.

Figure 2A:
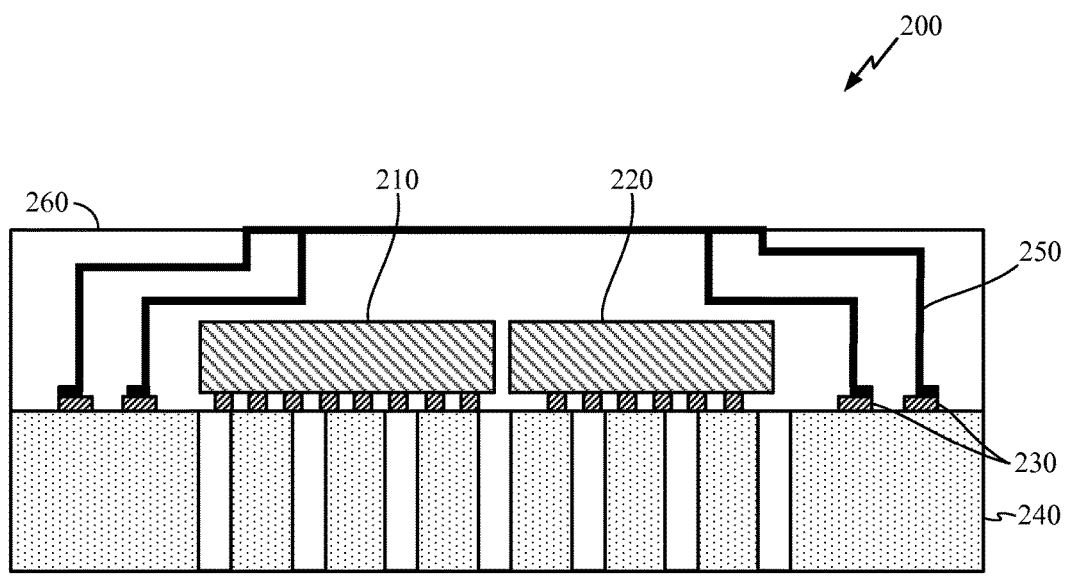
FIG. 2A depicts an exemplary block diagram of a bottom package structure with a connection frame and molding.

FIG. 2A depicts an exemplary block diagram of a bottom package structure with a connection frame and molding. As shown in FIG. 2A, a bottom package structure 200 may include a first die 210, a second die 220, and a plurality of bonding pads 230. The die 210, die 220, and bonding pads 230 may be mounted on a substrate or interposer 240. The interposer 240 may provide an interface between a top and a bottom of the interposer 240 as well as an interface between components attached to the interposer 240. The bottom package structure 200 may include a mold material 260 encapsulating the components on the top of interposer 240. The mold material 260 may be any type of dielectric material. The mold material 260 may encapsulate all of the components including the frame 250 as an over mold or may encapsulate only a portion of the components.

Figure 2B:
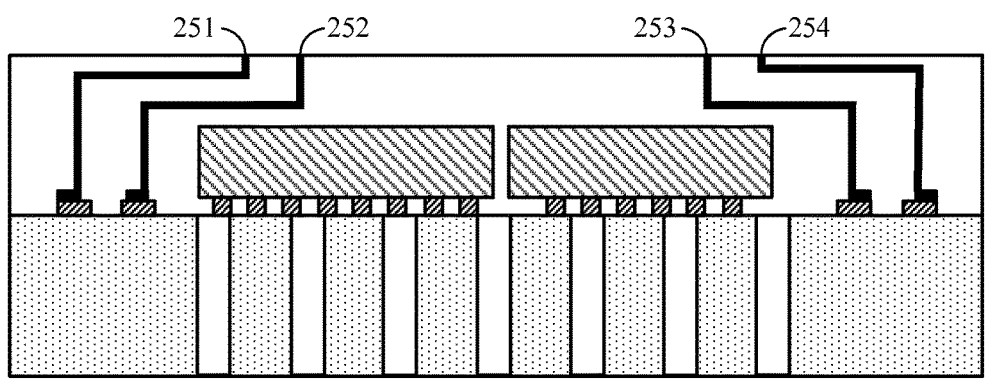
FIG. 2B depicts an exemplary block diagram of a bottom package structure with a connection frame and molding.

FIG. 2B depicts an exemplary block diagram of a bottom package structure with a connection frame and molding. As shown in FIG. 2B, a bottom package structure 200 may include a plurality of bonding pads 230 and a connection frame 250 coupled to the plurality of bonding pads 230. The connection frame 250 may be a conductive material such as lead. The connection frame 250 may be coupled to one or more bonding pads 230 and may be coupled with a solder or adhesive that allows an electrical connection between at least one pad and the frame.

The mold material 260 as shown may have a portion removed to expose portions of frame 250 forming branches or pathways to pads 230. The process of removing the old material may include grinding or other mechanical removal techniques as well as laser ablation and similar techniques. In FIG. 2B, four branches 251-254 provide the connection with pads 230. The branches 251-254 may be formed by grinding the mold material encapsulating the top of frame 250 to remove the mold material and the connection portion of frame 250 to expose the branches 251-254 and isolate them from each other. As shown, the frame 250 includes four branches 251-254 that provide separate electrical pathways or connections but it should be understood that this can be more or less depending on the amount of connections or pathways desired. The frame branches 251-254 are shown extending vertically and horizontally upward with 90 degree bends from the pads 230 to a point over the dies 210 and 220 that may easily allow connections with pinouts of a memory (not shown) situated directly above dies 210 and 220. It should be understood that the branches may be configured to be directed to any point necessary including using angles other than 90 degrees or no angles at all. It should also be understood, that the step of removing mold material in order to expose portions of the frame 250 in order to de-couple the branches from each other is option in the case where the branches were formed separately to begin with.

Figure 3:
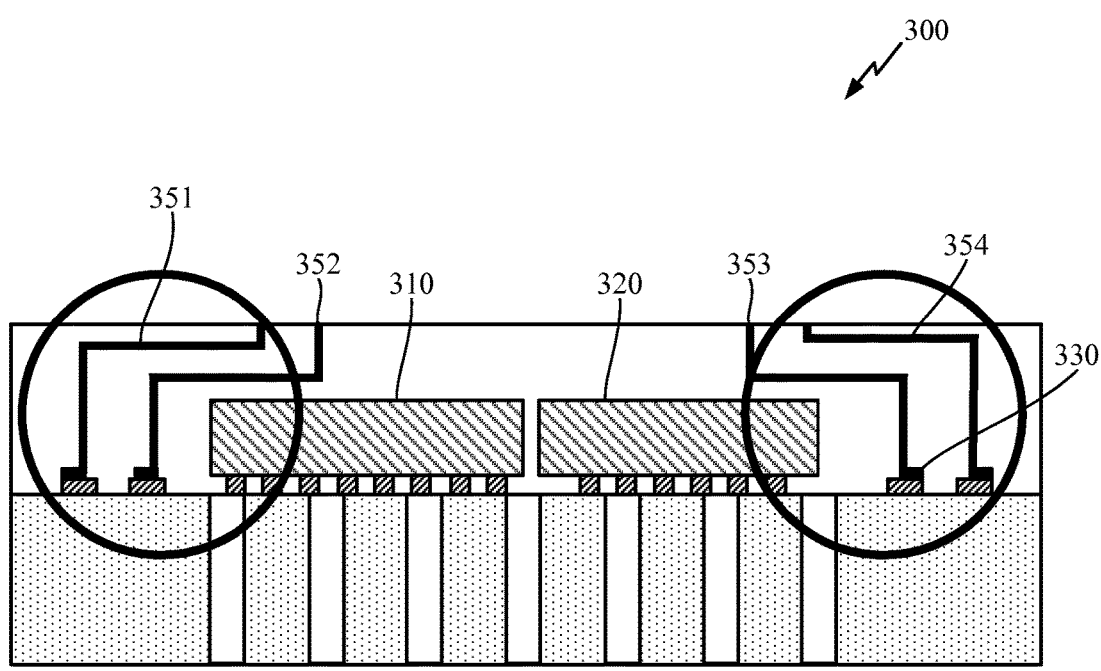
FIG. 3 depicts an exemplary block diagram of a bottom package structure with a connection frame and molding.

FIG. 3 depicts an exemplary block diagram of a bottom package structure with a connection frame and molding. As shown in FIG. 3, a bottom package structure 300 may include a plurality of bonding pads 330 and connections 351-354 coupled to the plurality of bonding pads 330. The connections 351-354 may be a conductive material such as lead. The connections 351-354 may be coupled to one or more bonding pads 330 and may be coupled with a solder or adhesive that allows an electrical connection between at least one pad and the connections 351-354. As shown, the connections 351-354 include four branches that provide separate electrical pathways or connections but it should be understood that this can be more or less depending on the amount of connections or pathways desired. The connections 351-354 are shown extending vertically and horizontally upward with 90 degree bends from the pads 330 to a point over the dies 310 and 320 that may easily allow connections with pinouts of die or chip in a top package situated directly above dies 310 and 320. It should be understood that the connections may be configured to be directed to any point necessary including using angles other than 90 degrees or no angles at all. The capability of directed the location of the end points and the number of connections allows the package structure to avoid the use of a RDL or similar layer to redirect the connections to different or additional landing points.

Figure 4:
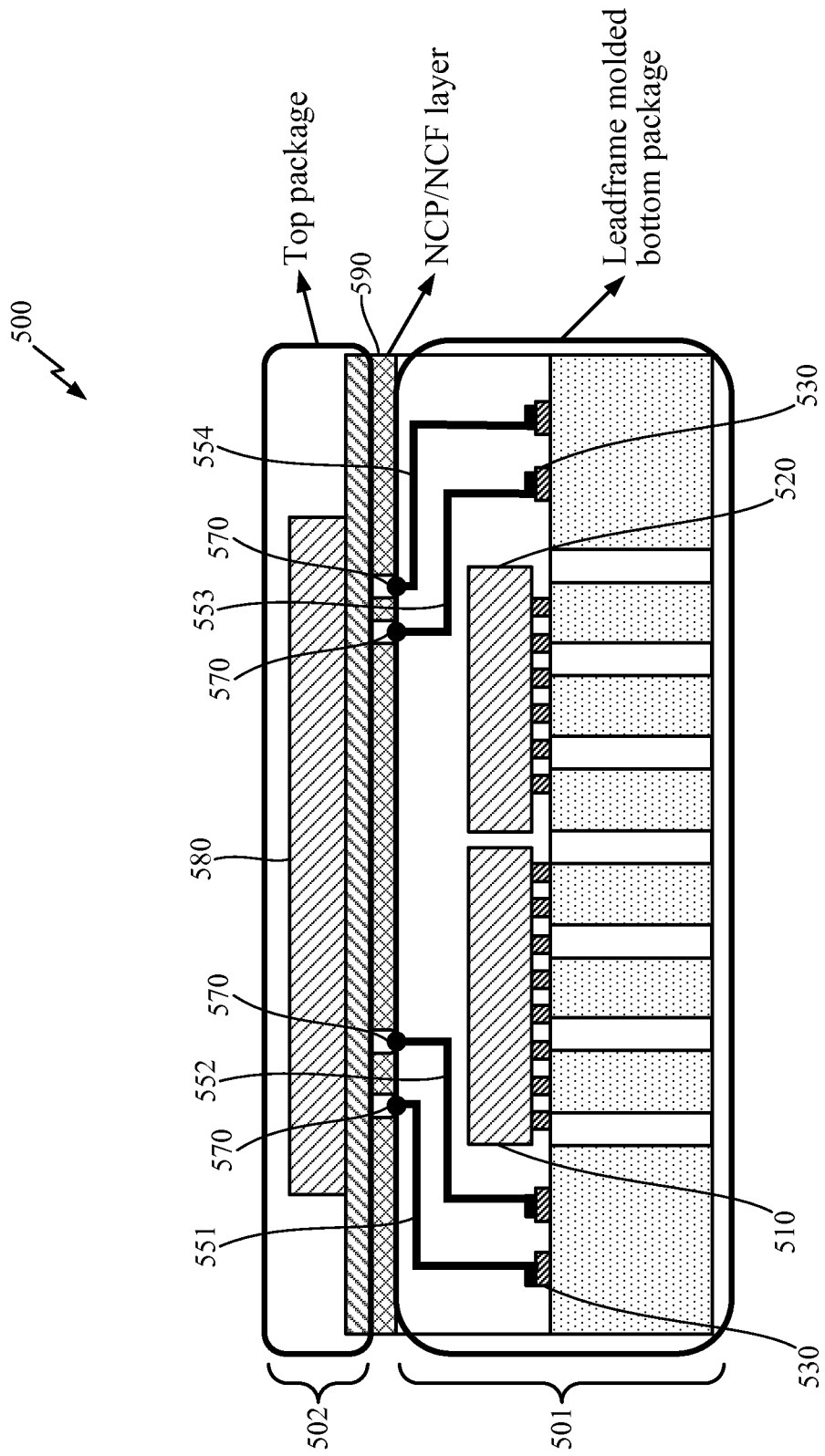
FIG. 4 depicts an exemplary block diagram of a package on package structure with a connection frame and molding.

FIG. 4 depicts an exemplary block diagram of a package on package structure with a connection frame and molding according to some embodiments of the disclosure. As shown in FIG. 4, a package on package structure 500 may include a bottom package 501 and a top package 502. The bottom package 501 may include a first die 510, second die 520, a plurality of bonding pads 530 and connections 551-554 coupled to the plurality of bonding pads 530. The connections 551-554 may be a conductive material such as lead. The connections 551-554 may be coupled to one or more bonding pads 530 and may be coupled with a solder or adhesive that allows an electrical connection between at least one pad and the connections 551-554. As shown, the connections 551-554 include four branches that provide separate electrical pathways or connections but it should be understood that this can be more or less depending on the amount of connections or pathways desired. The connections 551-554 are shown extending vertically and horizontally upward with 90 degree bends from the pads 530 to a corresponding plurality of top package connection points 570. The connection points 570 may provide connection points or landing pads for a third die 580 in the top package 502. The die 580 may be a memory chip or other component such as a logic chip or die. Top package 502 may be separated from bottom package 501 by a non-conductive layer 590 such as a non-conductive paste or non-conductive film (NCP/NCF) layer An exemplary process of manufacturing POP structure 500 will now be described. First, a bottom or first package is fabricated. The first package has a substrate such as an organic interposer, a first semiconductor die on a top of the substrate, and bonding pads on the top of the substrate. The first package may include more than a first die. Then, a frame is formed on the bonding pads. The frame can be pre-formed or formed as part of the attachment to the bonding pad step. Next, the frame is connected to the bonding pads on the first package. The connection may be formed by soldering the frame to the pad or adhering the frame to the pads using an adhesive such that an electrical connection is formed between a respective pad and the frame. Then, a package material is molded the top of the substrate and over the frame and first semiconductor die. The package or molding material may be a non-conductive or dielectric material. The package material may be over molded on the top substrate such that the material encapsulates the frame, the die, and the pads or substantially encapsulates these components.

Next, a portion of the molded package material is removed to expose at least a portion of the frame. The molding material may be removed by grinding or similar mechanical process as well as other techniques such as laser ablation. The exposed frame portions are formed such that a desired fan in or fan out configuration is obtained. Then, an oxidation protection may be applied to the exposed portions. Last, a second package having a die or chip is connected to the exposed portion of the frame coupling the first package with the second package to form a package on package structure. The process may include a step of adding a non-conductive layer between the first and second packages such a NCP or NCF.

It should be understood that although the description above mentions a lead frame, substitute materials can be used in place of a lead frame. The substitute materials can include any conductive material that is formable in a frame or pattern.

Embodiments of the methods, apparatus, and systems described herein can be used in a number of applications. For example, the described embodiments could be used in an integrated circuit package that combines at least two die or chips for interconnecting those die or chips. In addition, the described embodiments may be used for processors, memory, or power management devices in high lead count ball grid array (BGA) packages used in handheld devices or tablets where fine ball pitches are desired.

Further applications should be readily apparent to those of ordinary skill in the art.

Nothing stated or illustrated depicted in this application is intended to dedicate any component, step, feature, object, benefit, advantage, or equivalent to the public, regardless of whether the component, step, feature, object, benefit, advantage, or the equivalent is recited in the claims.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some exemplary embodiments, some or a plurality of the most important method steps can be performed by such an apparatus.

The exemplary embodiments described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the exemplary embodiments herein.

In the detailed description above it can be seen that different features are grouped together in exemplary embodiments. This manner of disclosure should not be understood as an intention that the claimed exemplary embodiments require more features than are explicitly mentioned in the respective claim. Rather, the situation is such that inventive content may reside in fewer than all features of an individual exemplary embodiment disclosed. Therefore, the following claims should hereby be deemed to be incorporated in the description, wherein each claim by itself can stand as a separate exemplary embodiment. Although each claim by itself can stand as a separate exemplary embodiment, it should be noted that-although a dependent claim can refer in the claims to a specific combination with one or a plurality of claims-other exemplary embodiments can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some exemplary embodiments, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A packaged semiconductor device, comprising:
   a first package comprising a substrate, a first die coupled to the substrate, and a bonding pad over the substrate;
   a second package comprising a second die located vertically above the first die;
   a frame coupled to the bonding pad and the frame coupled to the second package at a connection point, wherein the connection point is horizontally offset from the bonding pad and is horizontally located between the first die and the second die; and
   a non-conductive layer between the first package and the second package such that the first package directly contacts the non-conductive layer and the second package directly contacts the non-conductive layer without an air gap between the first package and the non-conductive layer and the second package and the non-conductive layer.

2. The packaged semiconductor device of claim 1, wherein the frame is composed of lead.

3. The packaged semiconductor device of claim 1, wherein the frame forms an interconnect pattern offset from the bonding pad.

4. The packaged semiconductor device of claim 1, wherein the substrate comprises an organic interposer.

5. The packaged semiconductor device of claim 1, wherein the first die is a logic die and the second die is a memory.

* * * * *